(12) United States Patent
Moon et al.

(10) Patent No.: US 10,998,051 B2
(45) Date of Patent: May 4, 2021

(54) MEMORY CONTROLLER AND OPERATING METHOD THEREOF

(71) Applicant: SK hynix Inc., Gyeonggi-do (KR)

(72) Inventors: Min Hwan Moon, Seoul (KR); Seon Ju Lee, Gyeonggi-do (KR); Jung Chul Han, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 192 days.

(21) Appl. No.: 16/384,282

(22) Filed: Apr. 15, 2019

(65) Prior Publication Data

US 2020/0043556 A1 Feb. 6, 2020

(30) Foreign Application Priority Data

Jul. 31, 2018 (KR) .................. 10-2018-0089616

(51) Int. Cl.
*G06F 3/06* (2006.01)
*G11C 11/56* (2006.01)
*G11C 16/16* (2006.01)
*G11C 16/26* (2006.01)
*G11C 16/32* (2006.01)
*G11C 16/34* (2006.01)
*G11C 16/04* (2006.01)

(52) U.S. Cl.
CPC ............ *G11C 16/16* (2013.01); *G06F 3/0604* (2013.01); *G06F 3/0652* (2013.01); *G06F 3/0659* (2013.01); *G06F 3/0679* (2013.01); *G11C 16/0483* (2013.01); *G11C 16/26* (2013.01)

(58) Field of Classification Search
CPC ..... G11C 16/16; G11C 16/0483; G11C 16/26; G11C 16/32; G11C 11/5635; G11C 16/345; G11C 16/3445; G11C 16/344; G06F 3/0679; G06F 3/0652; G06F 3/0659; G06F 3/0604; G06F 3/064
See application file for complete search history.

(56) References Cited

FOREIGN PATENT DOCUMENTS

KR 10-2008-0048301 6/2008
KR 10-2016-0046954 5/2016

*Primary Examiner* — Christopher D Birkhimer
(74) *Attorney, Agent, or Firm* — IP & T Group LLP

(57) ABSTRACT

In a memory controller configured to control a memory device including a plurality of memory blocks, the memory controller comprising: a memory interface configured to exchange data with the memory device; and a pre-program controller configured to perform a read operation on a last page of a program sequence for a plurality of pages in an erase target memory block when the memory device is in an idle state, and perform a pre-program operation on the erase target memory block according to the result obtained by performing the read operation, wherein the erase target memory block is a memory block on which an erase operation is to be performed among the plurality of memory blocks, and wherein the erase operation on the erase target memory block is performed after the pre-program operation is performed.

20 Claims, 16 Drawing Sheets

FIG. 10

| 1st Page | 2nd Page | ... | Super Block 0 |
|---|---|---|---|
| ⋮ |  |  |  |
|  |  |  |  |
|  |  |  |  |
|  |  |  | Last Order Page |

FIG. 11

MEMORY BLOCK MANAGER(212)

| # of Super Block | STATUS INFORMATION |
|---|---|
| Super Block 0 | 0 |
| Super Block 2 | 1 |
| ⋮ | ⋮ |
| Super Block k | 0 | ns
MEMORY CONTROLLER AND OPERATING METHOD THEREOF

CROSS-REFERENCE TO RELATED APPLICATION

The present application claims priority under 35 U.S.C. § 119(a) to Korean patent application number 10-2018-0089616, filed on Jul. 31, 2018, the entire disclosure of which is incorporated herein by reference in its entirety.

BACKGROUND

1. Field of Invention

The present disclosure generally relates to an electronic device, and more particularly, to a memory controller and an operating method thereof.

2. Description of Related Art

A storage device stores data under the control of a host device such as a computer or a smart phone. The storage device may include a memory device for storing data and a memory controller for controlling the memory device. The memory device may be a volatile memory device or a nonvolatile memory device.

The volatile memory device stores data only when power is supplied; that is, stored data disappears when the supply of power is interrupted. The volatile memory device may be a Static Random Access Memory (SRAM), a Dynamic Random Access Memory (DRAM), or the like.

In contrast, data stored in a nonvolatile memory device does not disappear even when the supply of power is interrupted. The nonvolatile memory device may be a Read Only Memory (ROM), a Programmable ROM (PROM), an Electrically Programmable ROM (EPROM), an Electrically Erasable ROM (EEROM), a flash memory, or the like.

SUMMARY

Embodiments provide a memory controller having an improved erase operation speed and an operating method thereof.

In accordance with an aspect of the present disclosure, there is provided a memory controller configured to control a memory device including a plurality of memory blocks, the memory controller comprising: a memory interface configured to exchange data with the memory device; and a pre-program controller configured to perform a read operation on a last page of a program sequence for a plurality of pages in an erase target memory block when the memory device is in an idle state, and perform a pre-program operation on the erase target memory block according to the result obtained by performing the read operation, wherein the erase target memory block is a memory block on which an erase operation is to be performed among the plurality of memory blocks, and wherein the erase operation on the erase target memory block is performed after the pre-program operation is performed.

In accordance with another aspect of the present disclosure, there is provided a memory controller configured to control a memory device including a plurality of memory blocks, the memory controller comprising: a memory interface configured to exchange data with the memory device; and a pre-program controller configured to read status information of an erase target memory block on which an erase operation is to be performed, among the plurality of memory blocks, and perform a pre-program operation on the erase target memory block according to the status information of the erase target memory block, wherein the erase operation on the erase target memory block is performed after the pre-program operation is performed, and wherein the status information represents whether the pre-program operation on the erase target memory block has been performed.

In accordance with still another aspect of the present disclosure, there is provided a method for operating a memory controller configured to control a memory device including a plurality of memory blocks, the method comprising: performing, when the memory device is in an idle state, a read operation on a last page of a program sequence for a plurality of pages in an erase target memory block on which an erase operation is to be performed, among the plurality of memory blocks; performing a pre-program operation on the erase target memory block according to the result obtained by performing the read operation; and performing the erase operation on the erase target memory block after the performing of the pre-program operation.

In accordance with still another aspect of the present disclosure, there is provided a memory controller configured to control a memory device including a plurality of planes each including a plurality of memory blocks, the memory controller comprising: a memory interface configured to exchange data with the memory device; and a pre-program controller configured to read a last page of a program sequence for a plurality of pages in an erase target super block, among super blocks, when the memory device is in an idle state, and perform a pre-program operation on the erase target super block according to the result obtained by reading the last page, wherein the super blocks each includes at least two memory blocks in different planes among the plurality of memory blocks, wherein an erase operation on the erase target super block is performed after the pre-program operation is performed, and wherein the erase target super block is a super block on which an erase operation is to be performed before data is programmed.

In accordance with still another aspect of the present disclosure, there is provided a memory controller configured to control a memory device including a plurality of planes each including a plurality of memory blocks, the memory controller comprising: a memory interface configured to exchange data with the memory device; and a pre-program controller configured to read status information of an erase target super block, and perform a pre-program operation on the erase target super block according to the status information, wherein the erase target super block is a super block on which an erase operation is to be performed before data is programmed, among super blocks, each including at least two memory blocks in different planes among the plurality of memory blocks, and wherein the status information represents whether the pre-program operation on the erase target super block has been performed.

In accordance with still another aspect of the present disclosure, there is provided a storage device comprising: a memory device including one or more erase target memory blocks; and a memory controller configured to: control, while the memory device is idle, the memory device to pre-program one or more pre-program target memory blocks, of the erase target memory blocks, which are detected by determining that last pages of the respective erase target memory blocks are not programmed, and control, while the memory device is running, the memory device to erase pre-program-completed target memory blocks, wherein the pre-program-completed target memory blocks are the pre-program target memory blocks that are pre-programmed.

BRIEF DESCRIPTION OF THE DRAWINGS

Various embodiments will now be described more fully with reference to the accompanying drawings; however, elements and features may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment," "another embodiment," or the like is not necessarily to only one embodiment, and different references to any such phrase are not necessarily to the same embodiment(s).

FIG. 10 is a diagram illustrating a last page of the super block.

FIG. 11 is a diagram illustrating status information stored in a memory block manager of FIG. 1.

DETAILED DESCRIPTION

Figure 1:
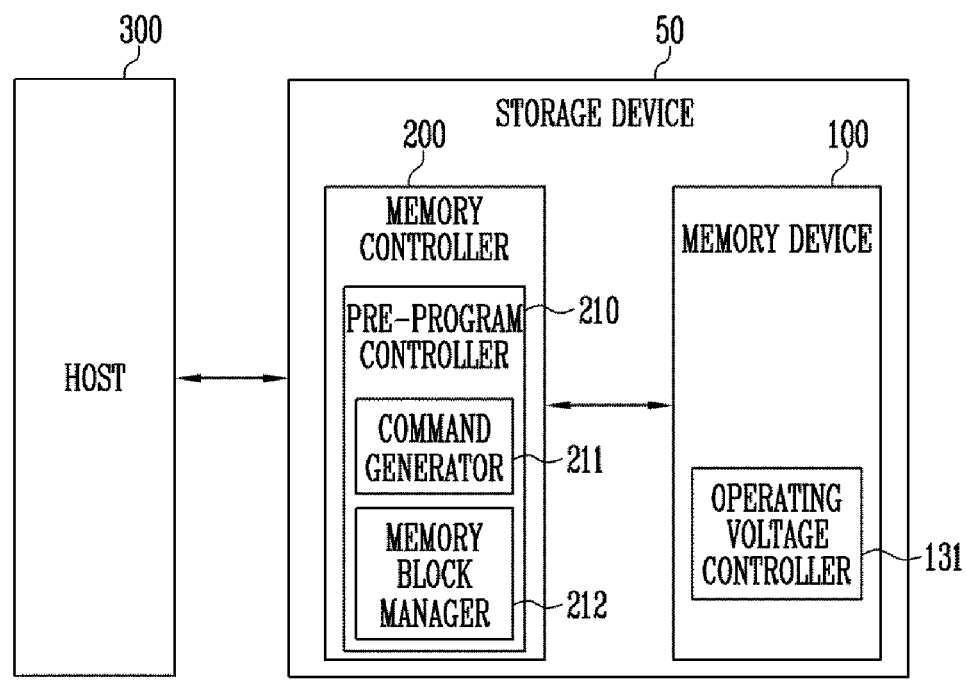
FIG. 1 is a diagram illustrating a storage device in accordance with an embodiment of the present disclosure.

The specific structural or functional description disclosed herein is for the purpose of describing embodiments in accordance with embodiments of the present disclosure. The present invention, however, may be implemented in other ways, which may be modifications or variations of any of the disclosed embodiments. Thus, as the present invention is not limited to the embodiments set forth herein.

The present embodiments are described and illustrated in detail. However, the embodiments are not limited to specific details. Rather, the present invention is intended to include all changes, equivalents, or substitutes that do not depart from the spirit and technical scope of the present disclosure.

While terms such as "first" and "second" may be used to identify various components, such components are not limited by any of the above terms. The above terms are used only to distinguish one component from another that otherwise have the same or similar names. For example, a first component in one instance may be referred to as a second component in another instance without departing from the scope of rights of the present disclosure.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "~ between," "immediately ~ between" or "adjacent to ~" and "directly adjacent to ~" may be construed similarly. Communication between two elements, whether directly or indirectly connected/coupled, may be wired or wireless, unless the context indicates otherwise.

The terms used in the present application are merely used to describe particular embodiments, and are not intended to limit the present disclosure. Singular forms in the present disclosure are intended to include the plural forms and vice versa, unless the context clearly indicates otherwise. It will be further understood that terms such as "including" or "having," etc., are intended to indicate the existence of stated features, numbers, operations, actions, components, parts, or combinations thereof but are not intended to preclude the possibility that one or more other features, numbers, operations, actions, components, parts, or combinations thereof may exist or may be added.

So far as not being differently defined, all terms used herein including technical or scientific terminologies have meanings that are commonly understood by those skilled in the art to which the present disclosure pertains. The terms having dictionary definitions should be understood such that they have meanings consistent with the context of the related technique. So far as not being clearly defined in this application, terms should not be understood in an ideally or excessively formal way.

In describing embodiments, description of techniques that are well known to the art to which the present disclosure pertains and are not directly related to the present disclosure is omitted. As a result, aspects and features of the present invention are more clearly presented.

Various embodiments of the present disclosure will be described in detail with reference to the accompanying drawings in order for those skilled in the art to be able to readily practice the present invention.

FIG. 1 is a diagram illustrating a storage device 50 in accordance with an embodiment of the present disclosure.

Referring to FIG. 1, the storage device 50 may include a memory device 100 and a memory controller 200 for controlling an operation of the memory device 100. The storage device 50 may store data under the control of a host 300, such as a mobile phone, a smart phone, an MP3 player, a laptop computer, a desktop computer, a game console, a TV, a tablet PC or an in-vehicle infotainment.

The storage device 50 may be configured as any one of various types of storage devices according to a host interface that is a communication scheme with the host 300. For example, the storage device 50 may be implemented by any one of various types of storage devices such as a multimedia card of a Solid State Drive (SSD), a Multi-Media Card (MMC), an embedded, Multi-Media Card (eMMC), a Reduced Size, Multi-Media Card (RS-MMC), and a micro-Multi-Media Card (micro-MMC) type, a Secure Digital (SD) card of a Secure Digital (SD), a mini-Secure Digital (mini-SD) and a micro-Secure Digital (micro-SD) type, an Universal Storage Bus (USB) storage device, a Universal Flash Storage (UFS) device, a storage device of a Personal Computer Memory Card International Association (PCM-CIA) card type, a storage device of a Peripheral Component Interconnection (PCI) card type, a storage device of a PCI-Express (PCI-E) card type, a Compact Flash (CF) card, a smart media card, and a memory stick.

The storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In an embodiment, the page may be a unit for storing data or reading data stored in the memory device 100. The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, by way of example, the memory device 100 is described in the context of a NAND flash memory. However, techniques described herein may be applied to other types of memory devices.

The memory device 100 receives a command and an address from the memory controller 200 and accesses an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 controls overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme so as to improve operational performance.

The host 300 may communicate with the storage device 50 using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

In an embodiment, the memory controller 200 may include a pre-program controller 210. The pre-program controller 210 may include a command generator 211 and a memory block manager 212.

When the memory device 100 is in an idle state, the command generator 211 may generate a read command or pre-program command for a memory block to be erased (erase target memory block), and provide the generated read command or pre-program command to the memory device 100. The pre-program command may be a command instructing to the memory device 100 to perform a pre-program operation on the erase target memory block before an erase operation is performed on that block.

The read command may instruct the memory device 100 to read a last page among a plurality of pages in the erase target memory block before an erase operation is performed on the erase target memory block. The plurality of pages included in a memory block may be sequentially programmed according to a predetermined sequence. The last page may be a page lastly programmed among the plurality of pages in the memory block.

The command generator 211 may provide the pre-program command to an operating voltage controller 131 in response to a read command provided by the memory device 100. When the last page is a programmed page as a result of executing the read command, the command generator 211 may provide the pre-program command to the operating voltage controller 131.

In an embodiment, when the memory device 100 is performing another operation, the command generator 211 may not provide the pre-program command to the operating voltage controller 131 even though the last page is a programmed page as a result of executing the read command.

In an embodiment, when the last page is a page that is not programmed, i.e., an erased page as a result of executing the read command, the command generator 211 may not provide the pre-program command to the operating voltage controller 131.

The memory block manager 212 may store status information representing whether a pre-program operation has been performed on a memory block, which may be a block in which its last page was determined as programmed as a result of executing the read command. Whether the pre-program operation has been performed may be determined according to whether a pre-program command for the memory block has been provided.

When a pre-program command for a memory block is provided, status information of the corresponding memory block may represent that a pre-program operation has been completed. When a pre-program command for a memory block is not provided, status information of the corresponding memory block may represent that a pre-program operation has not been completed.

The memory device 100 may include the operating voltage controller 131.

The operating voltage controller 131 may perform a prep-program operation on an erase target memory block, i.e., a memory block to be erased, in response to the received pre-program command. That is, the pre-program operation may be performed in units of memory blocks. The pre-program operation may be an operation of moving a threshold voltage of all memory cells in the erase target memory block to a set threshold voltage distribution.

A read operation on the last page and a pre-program operation on an erase target memory block may be performed in units of super blocks. The read operation on a super block may be a read operation on a page lastly programmed among a plurality of pages in the super block. The pre-program operation on a super block may be performed in units of memory blocks on all memory blocks in the super block. The super block may include at least two memory blocks in different planes among a plurality of memory blocks.

Figure 2:
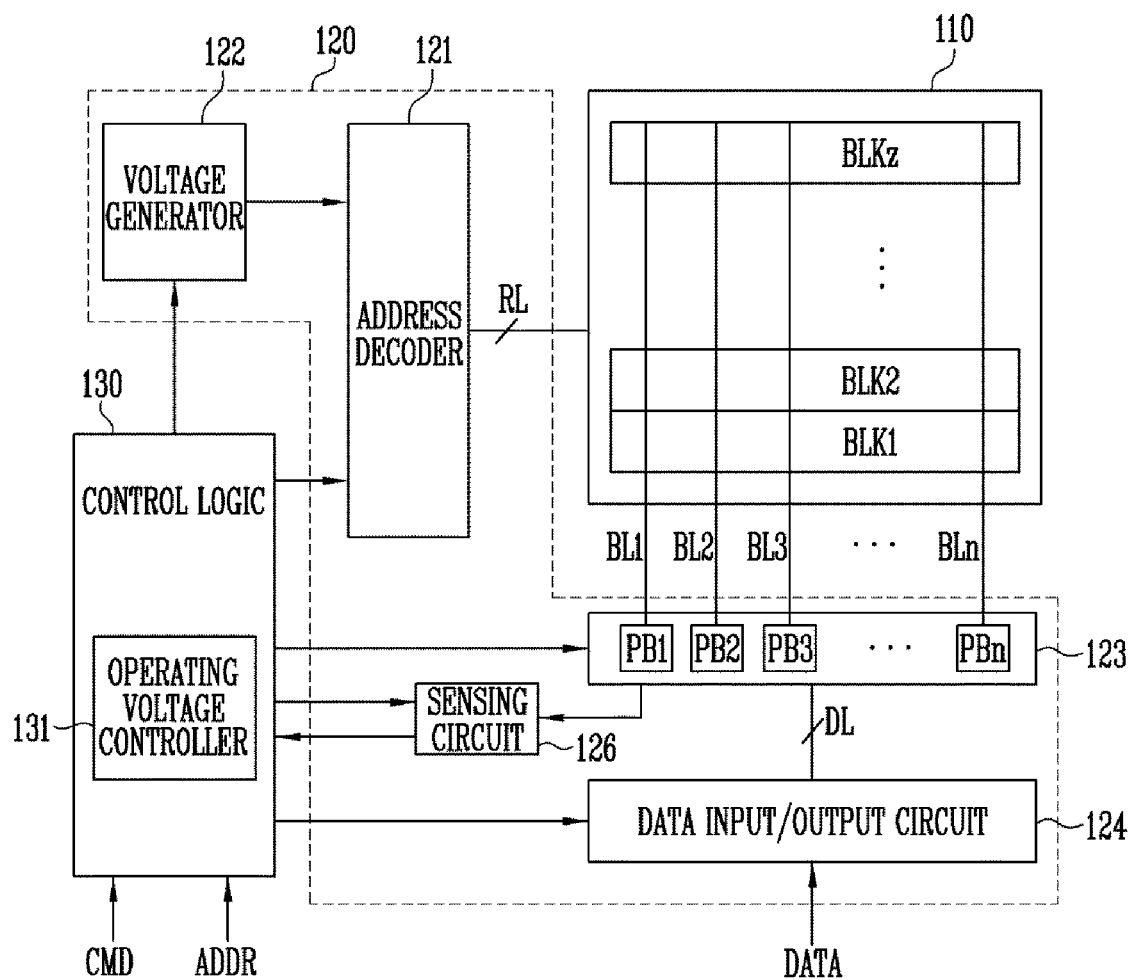
FIG. 2 is a diagram illustrating an exemplary structure of a memory device of FIG. 1.

FIG. 2 is a diagram illustrating a structure of the memory device 100 of FIG. 1.

Referring to FIG. 2, the memory device 100 may include a memory cell array 100, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Among the plurality of memory cells, memory cells coupled to the same word line may be defined as one page. That is, the memory cell array 110 may include a plurality of pages. In an embodiment, each of the plurality of memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device 100 may be configured as a single level cell (SLC) for storing one data bit, a multi-level cell (MLC) for storing two data bits, a triple level cell (TLC) for storing three data bits, or a quad level cell (QLC) for storing four data bits.

The peripheral circuit 120 may include the address decoder 121, a voltage generator 122, the read/write circuit 123, and a data input/output circuit 124.

The peripheral circuit 120 drives the memory cell array 110. For example, the peripheral circuit 120 may driver the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one-word line WL of the selected memory block by applying voltages provided to from the voltage generator 122 to the word line WL according to the decoded row address.

In a program operation, the address decoder 121 may apply a program voltage to the selected word line, and apply a program pass voltage having a level lower than that of the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line, and apply a read pass voltage higher than the read voltage to the unselected word lines.

In an embodiment, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In an embodiment, the address decoder 121 may decode a column address in the address ADDR transmitted thereto. The decoded column address may be transmitted to the read/write circuit 123. As an example, the address decoder 121 may include components such as a row decoder, a column decoder, and an address buffer.

The voltage generator 122 may generate a plurality of voltages by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of voltages having various voltage levels, the voltage generator 122 may include a plurality of pumping capacitors for receiving the internal power voltage, and generate a plurality of voltages by selectively activating the plurality of pumping capacitors under the control of the control logic 130.

The plurality of generated voltages may be supplied to the memory cell array 110 by the address decoder 121.

The read/write circuit 123 includes first to nth page buffers PB1 to PBn. The first to nth page buffers PB1 to PBn are coupled to the memory cell array 110 respectively through the first to nth bit lines BL1 to BLn. The first to nth page buffers PB1 to PBn operate under the control of the control logic 130.

The first to nth page buffers PB1 to PBn communicate data with the data input/output circuit 124. In a program operation, the first to nth page buffers PB1 to PBn receive data DATA to be stored through the data input/output circuit 124 and data lines DL.

In a program operation, the first to nth page buffers PB1 to PBn may transfer, to selected memory cells through the bit lines BL1 to BLn, data DATA received through the data input/output circuit 124 when a program pulse is applied to a selected word line. The memory cells of the selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to nth page buffers PB1 to PBn read data from the selected memory cells through the bit lines BL1 to BLn.

In a read operation, the read/write circuit 123 may read data DATA from memory cells of a selected page through the bit lines BL, and store the read data DATA in the first to nth page buffers PB1 to PBn.

In an erase operation, the read/write circuit 123 may float the bit lines BL. In an embodiment, the read/write circuit 123 may include a column select circuit.

The data input/output circuit 124 is coupled to the first to nth page buffers PB1 to PBn through the data lines DL. The data input/output circuit 124 operates under the control of the control logic 130.

The data input/output circuit 124 may include a plurality of input/output buffers (not shown) that receive input data. In a program operation, the data input/output circuit 124 may receive data DATA to be stored from an external controller (not shown). In a read operation, the data input/output circuit 124 outputs, to the external controller, data transmitted from the first to nth page buffers PB1 to PBn included in the read/write circuit 123.

In a read operation or verify operation, a sensing circuit 126 may generate a reference current in response to an allow bit signal generated by the control logic 130, and output a pass signal or fail signal to the control logic 130 by comparing a sensing voltage received from the read/write circuit 123 and a reference voltage generated by the reference current.

The control logic 130 may be coupled to the address decoder 121, the voltage generator 122, the read/write circuit 123, the data input/output circuit 124, and the sensing circuit 126. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal, a row address, a read/write circuit control signal, and an allow bit in response to the command CMD and the address ADDR. The control logic 130 may output the operation signal to the voltage generator 122, output the row address to the address decoder 121, output the read/write circuit control signal to the read/write circuit 123, and output the allow bit to the sensing circuit 126. Also, the control logic 130 may determine whether the verify operation has passed or failed in response to the pass or fail signal output by the sensing circuit 126.

In an embodiment, the control logic 130 may include an operating voltage controller 131. When a pre-program command is received from the command generator 211 described with reference to FIG. 1, the operating voltage controller 131 may control voltages applied to an erase target memory block such that a pre-program operation on that memory block is performed.

The pre-program command may represent that a pre-program operation is to be performed on a memory block, i.e., an erase target memory block, before an erase operation is performed on that block. The pre-program operation may be performed in units of memory blocks. The pre-program operation may be an operation of moving a threshold voltage of all memory cells in the erase target memory block to a set threshold voltage distribution.

In the pre-program operation, a program voltage may be applied to word lines coupled to the erase target memory block. In the pre-program operation, a ground voltage may be applied to bit lines coupled to the erase target memory block. In the pre-program operation, a program verify operation may be omitted.

Figure 3:
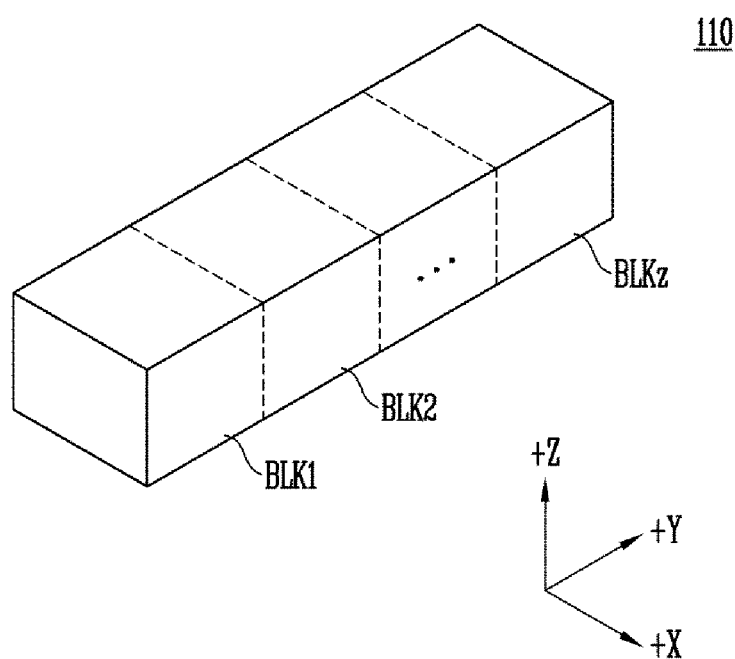
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
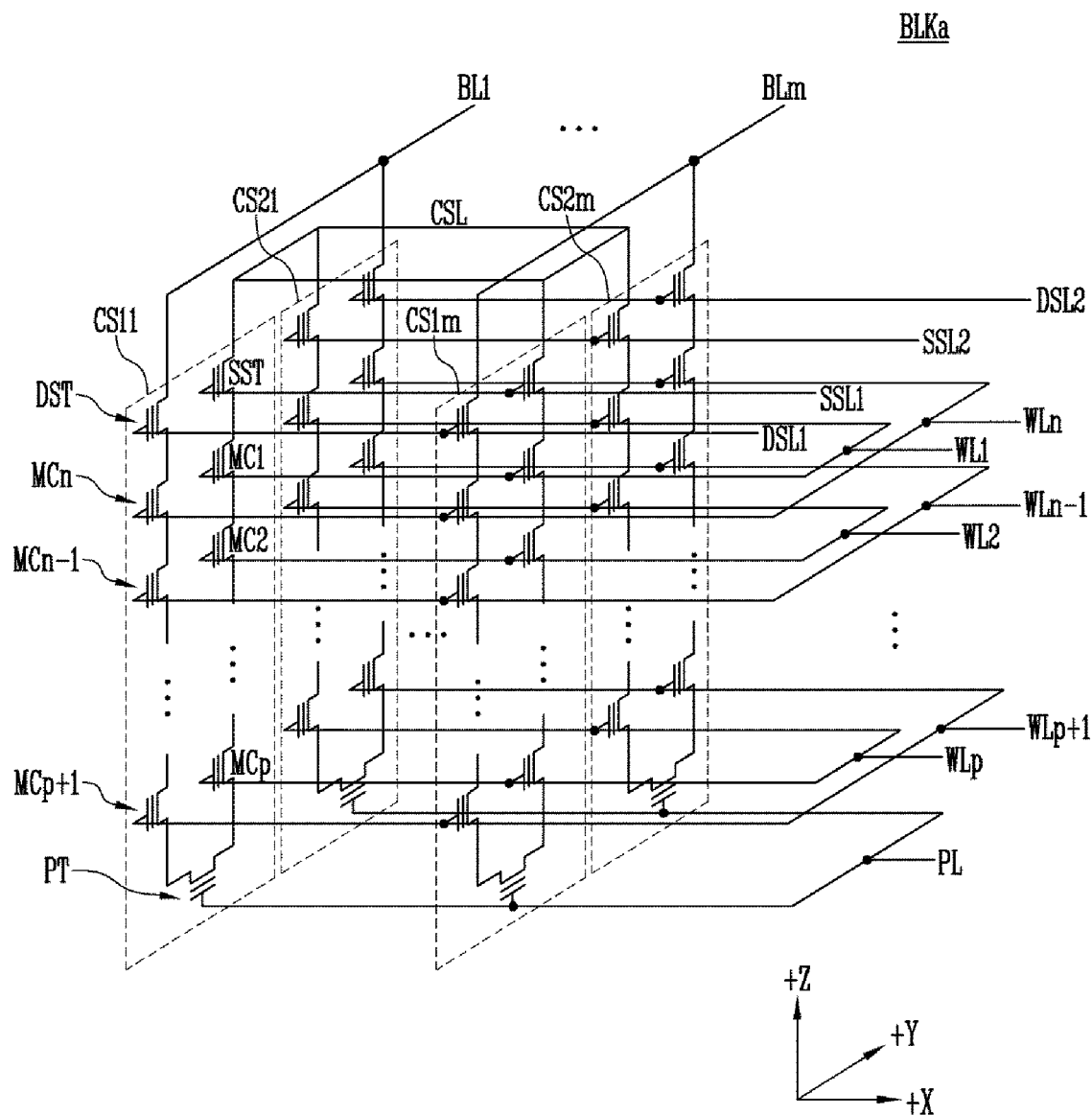
FIG. 4 is a circuit diagram illustrating an embodiment of any one memory block among memory blocks of FIG. 3.

FIG. 4 is a circuit diagram illustrating an embodiment of any one memory block BLKa among the memory blocks BLK1 to BLKz of FIG. 3.

Referring to FIG. 4, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 4 illustrates two cell strings arranged in a column direction (i.e., a +Y direction). However, this is for clarity; three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the −Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
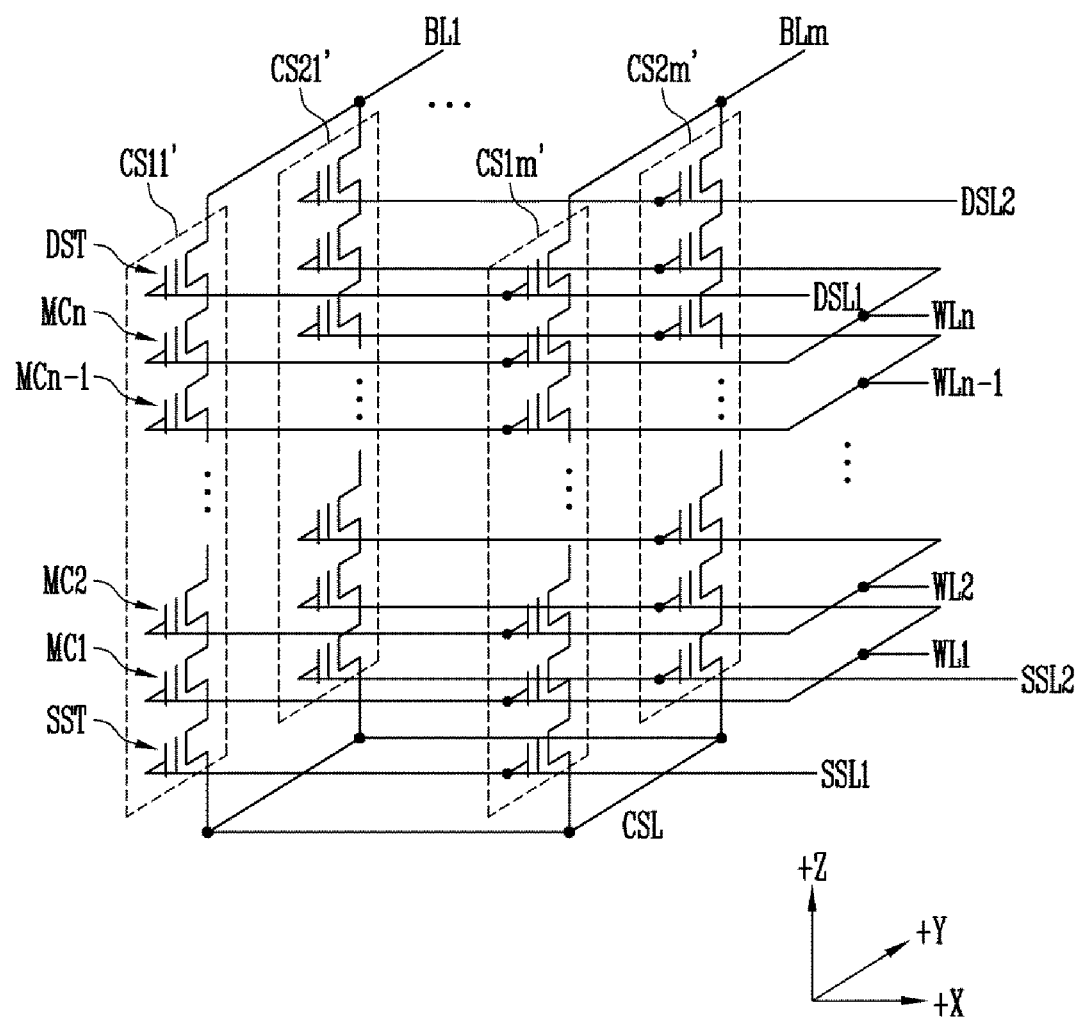
FIG. 5 is a circuit diagram illustrating an embodiment of a memory block among the memory blocks of FIG. 3.

FIG. 5 is a circuit diagram illustrating another embodiment BLKb of a memory block among the memory blocks BLK1 to BLKz of FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
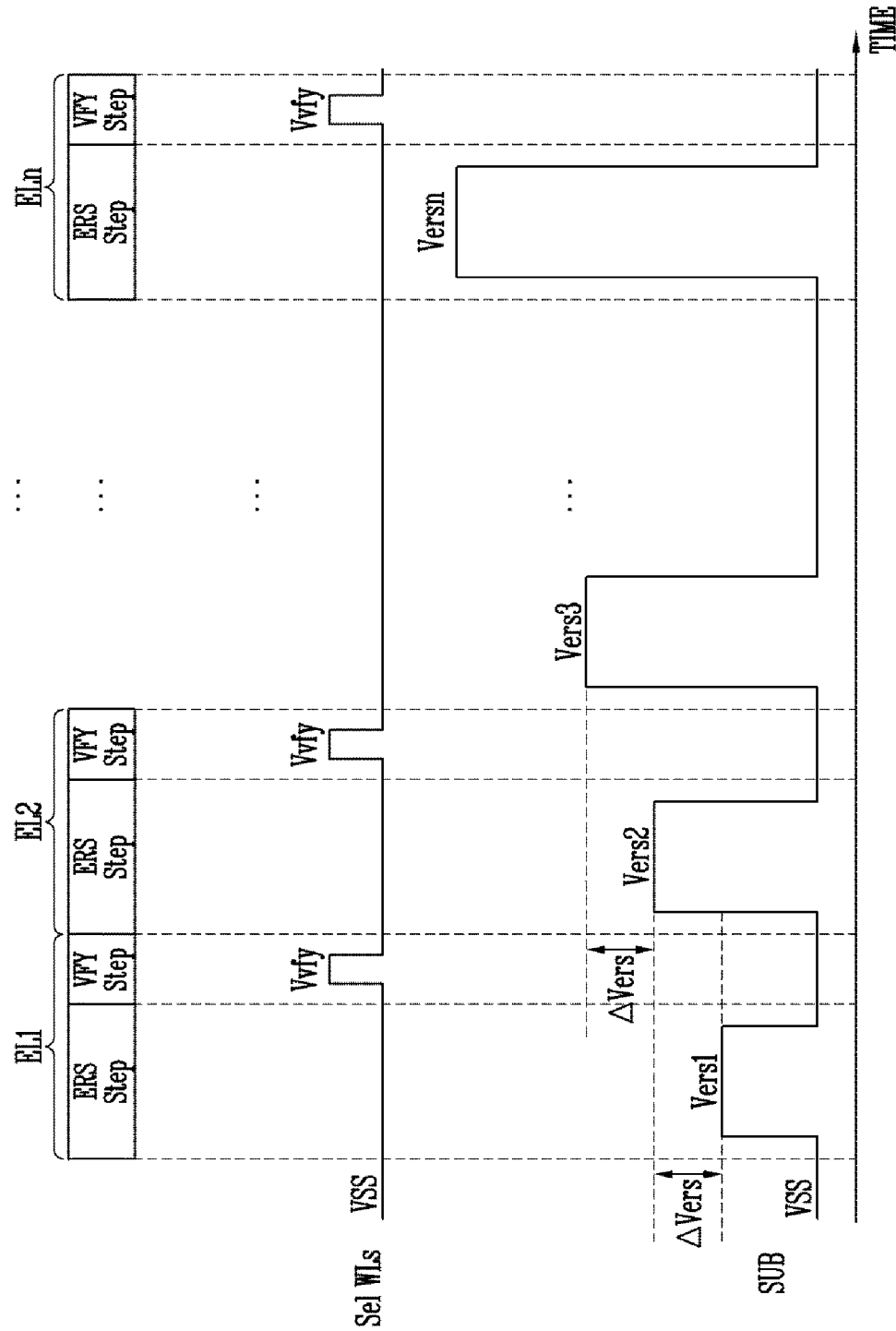
FIG. 6 is a diagram illustrating an erase operation of a memory block.

FIG. 6 is a diagram illustrating an erase operation of a memory block.

Referring to FIG. 6, the erase operation may include first to nth erase loops EL1 to ELn (n is a positive integer of 1 or more). Each erase loop may include an erase step ERS Step and a verify step VFY Step.

In the erase step ERS Step, an erase voltage Vers may be applied to a channel area of a plurality of memory cell strings included in the memory block. That is, the erase voltage Vers may be applied to a substrate SUB including the channel area. A ground voltage VSS may be applied to word lines coupled to the memory block while the erase voltage Vers is being applied.

In the verify step VFY Step, the memory device may determine whether memory cells in the memory block have a threshold voltage corresponding to an erase state. Specifically, in the verify step VFY Step, an erase verify voltage Vvfy may be applied to the word lines coupled to the memory block. The memory cells may be determined as on cells or off cells according to whether the threshold voltage of the memory cells is lower than the erase verify voltage Vvfy.

For example, when the threshold voltage of the memory cells is lower than the erase verify voltage Vvfy, the memory cells may be determined as on cells. When the threshold voltage of the memory cells is higher than or equal to the erase verify voltage Vvfy, the memory cells may be determined as off cells. In verify step VFY Step, when the number of memory cells having a threshold voltage lower than the erase verify voltage Vvfy exceeds a set number, the erase operation may pass. When the number of memory cells having a threshold voltage lower than the erase verify voltage Vvfy is less than or equal to the set number, the erase operation may fail. The erase loop EL may be repeated until the erase operation passes.

Whenever the erase loop EL is repeated, the level of the erase voltage Vers may be increased by a step voltage $\Delta$Vers according to the Incremental Step Pulse Erase (ISPE) scheme. That is, the level of an erase voltage Vers2 of the second erase loop EL2 may be erase voltage Vers1 of the first erase loop EL1 plus $\Delta$Vers (Vers1+$\Delta$Vers). More generally, the level of the erase voltage Versn of the nth erase loop ELn may be the erase voltage Vers(n−1) plus $\Delta$Vers (Vers(n−1)+$\Delta$Vers).

In an embodiment, in an erase step ERS Step of the first erase loop EL1, an erase voltage Vers1 may be applied to the channel area of the plurality of memory cell strings included in the memory block. That is, the erase voltage Vers1 may be applied to the substrate SUB including the channel area. The ground voltage VSS may be applied to the word lines coupled to the memory block while the erase voltage Vers1 is being applied. When the erase step ERS Step is ended, a verify step VFY Step may be performed.

In the verify step VFY Step of the first erase loop EL1, the erase verify voltage Vvfy may be applied to the word lines coupled to the memory block. When the erase operation passes in the verify step VFY Step, the erase operation may be ended. When the erase operation fails in the verify step VFY Step, the second erase loop EL2 may be performed. The second erase loop EL2 may also be performed in the same manner as the first erase loop EL1. The second to nth erase loops EL2 to ELn may be performed until the erase operation passes.

Figure 7:
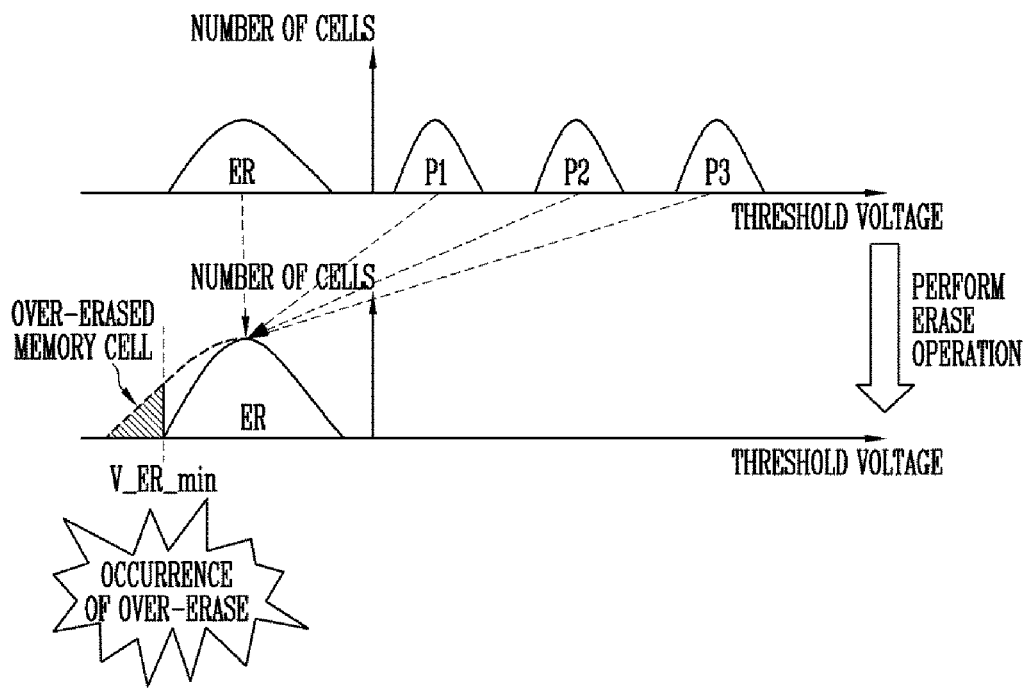
FIG. 7 is a diagram illustrating an over-erase phenomenon occurring in an erase operation of a memory block.

FIG. 7 is a diagram illustrating an over-erase phenomenon occurring in an erase operation of a memory block.

Referring to FIG. 7, the horizontal axis represents threshold voltage, and the vertical axis represents number of memory cells.

Each of memory cells may be configured as a single level cell (SLC) for storing one data bit, a multi-level cell (MLC) for storing two data bits, a triple level cell (TLC) for storing three data bits, or a quad level cell (QLC) for storing four data bits. By way of example, an arrangement in which the memory cell is an MLC storing two data bits is described here.

Each of the memory cells may be in any of an erase state ER, a first program state P1, a second program state P2, and a third program state P3. Each of the memory cells may be programmed to have any of the program states, i.e., the first program state P1, the second program state P2, or the third program state P3.

When an erase operation is performed, the programmed memory cells may have the erase state ER.

Specifically, through the erase operation, memory cells having any one state among the first to third program state P1 to P3 may have a threshold voltage corresponding to the erase state ER.

When a threshold voltage of a memory cell is less than a set threshold voltage after the erase operation is performed, the memory cell may be an over-erased memory cell. The set threshold voltage may be a minimum value of a threshold voltage distribution corresponding to the erase state ER. In FIG. 7, a slashed portion may be an area representing over-erased memory cells. A phenomenon in which an over-erased memory cell occurs after the erase operation is performed is referred to as an over-erase phenomenon. The over-erase phenomenon may occur when an erase voltage having the same level is applied to memory cells having different program states.

When the erase voltage having the same level is applied to memory cells having different program states, the amount that a threshold voltage is to be decreased to the threshold voltage distribution corresponding to the erase state ER may be different depending on the memory cells. Therefore, when the erase voltage having the same level is continuously applied even though the amount that the threshold voltage is to be decreased is different depending on program states of the memory cells, memory cells having a program state adjacent to the erase state ER may be over-erased. When a program operation is performed, a program voltage to be applied to the over-erased memory cells may be higher than that applied to the memory cells having the erase state ER.

Figure 8:
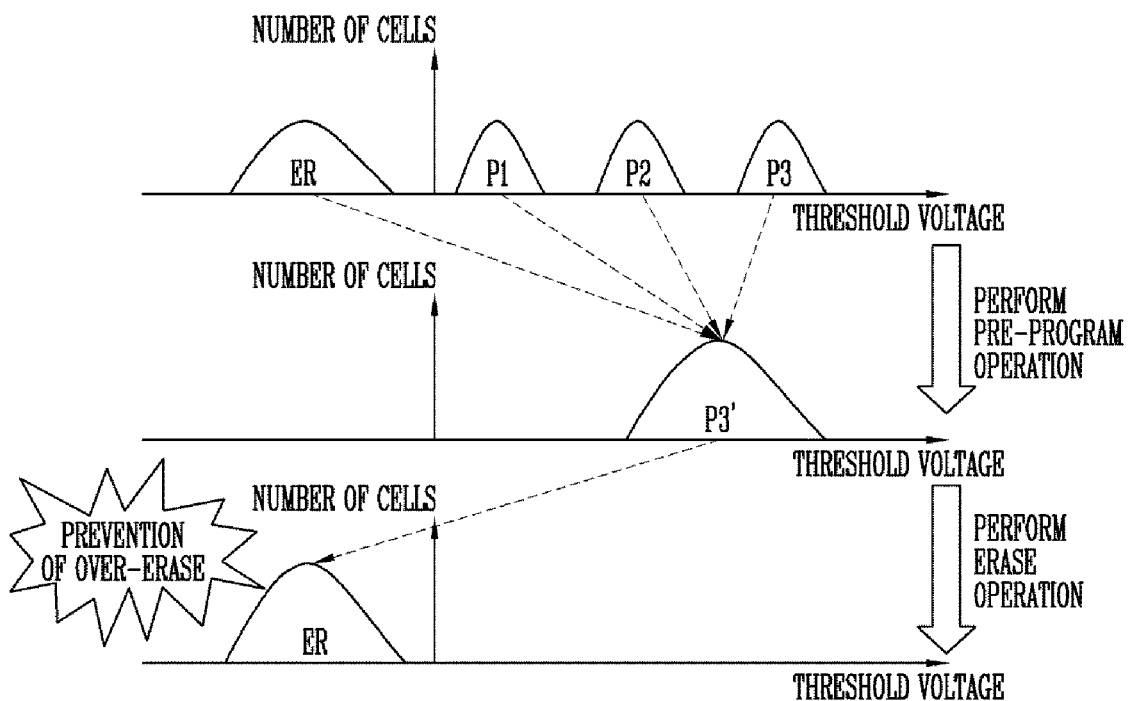
FIG. 8 is a diagram illustrating a pre-program operation.

FIG. 8 is a diagram illustrating a pre-program operation.

Referring to FIG. 8, the horizontal axis represents threshold voltage, and the vertical axis represents number of memory cells.

In order to prevent the over-erase phenomenon described with reference to FIG. 7, a pre-program operation may be performed on memory cells before an erase operation is performed on those memory cells. The pre-program operation may be an operation of moving a threshold voltage of all memory cells in a memory block to a set threshold voltage distribution.

Specifically, a program voltage may be applied to word lines coupled to a memory block in the pre-program operation. The program voltage applied in the pre-program operation may be a program voltage corresponding to the highest program state. In the pre-program operation, a ground voltage may be applied to bit lines coupled to the memory block. In the pre-program operation, a program verify operation may be omitted. For example, in the pre-program operation, the program voltage may be applied a preset number of times.

In an embodiment, after the pre-program operation is performed, the memory cells may have a threshold voltage corresponding to a threshold voltage distribution P3'. After the pre-program operation is performed, the erase operation may be performed. Since an erase voltage is applied to the pre-programmed memory cells in a state in which the memory cells belong to the same threshold voltage distribution P3', the memory cells after the erase operation may not be over-erased, unlike the case described with reference to FIG. 7.

Figure 9:
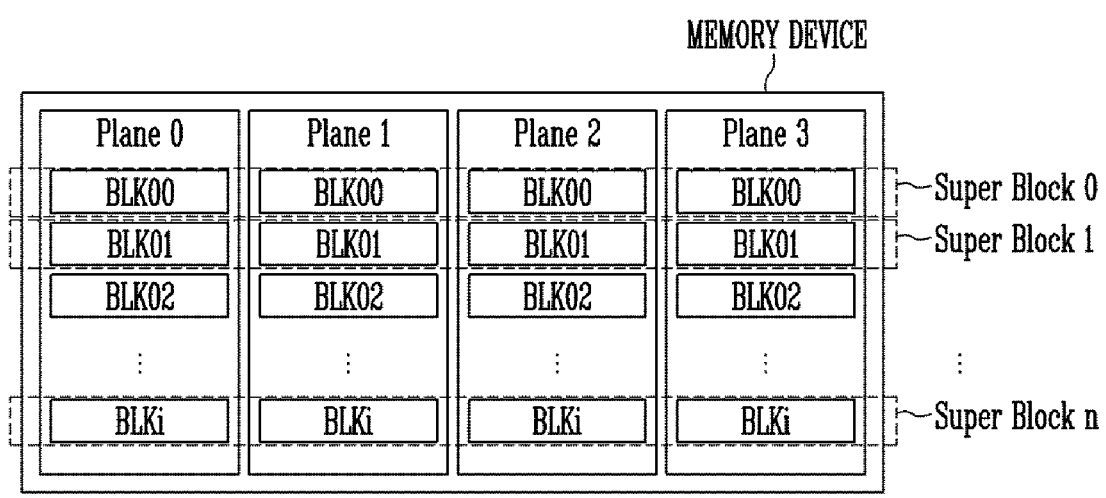
FIG. 9 is a diagram illustrating a super block.

FIG. 9 is a diagram illustrating a super block.

Referring to FIG. 9, a single memory device may include a plurality of planes. One plane may include a plurality of memory blocks. A super block may include at least two memory blocks in different planes among a plurality of memory blocks.

In the illustrated embodiment, an example in which the memory device includes zeroth to third planes (Plane0 to Plane3). The number of planes included in the memory device may vary. A zeroth super block Super Block 0 may include four memory blocks (memory blocks BLK01) in the zeroth to third planes Plane0 to Plane3 respectively. A first super block Super Block 1 may include four memory blocks (memory blocks BLK01) in the zeroth to third planes Plane0 to Plane3 respectively. More generally, an nth super block Super Block n (n is a positive integer of 1 or more) may include four memory blocks (memory blocks BLKi, i is a positive integer of 1 or more) in the zeroth to third planes Plane0 to Plane3 respectively. A single memory device may include zeroth super block Super Block 0 to an nth super block Super Block n. The number of super blocks included in the memory device may vary, as may the number of memory blocks in a given super block.

In various embodiments, a super block may include at least two memory blocks in different memory devices.

FIG. 10 is a diagram illustrating a last page of the super block.

Referring to FIG. 10, one super block may include a plurality of pages. The plurality of pages in the super block may be sequentially programmed according to a predetermined sequence. A last page (Last Order Page) may be a page lastly programmed among the plurality of pages in the super block. According to the result obtained by reading the last page in the super block, it may be determined whether all pages included in the super block have been programmed.

When the last page of a super block is determined to be a programmed page, it is further determined that all pages in the super block have been programmed. When it is determined that the last page of a super block is not programmed, i.e., is determined to be an erased page, it is further determined that at least one page among a plurality of pages in the super block is an erased page.

Data of the programmed page may include at least one 0. Data of the erased page all represent 1.

FIG. 11 is a diagram illustrating a status information table stored in the memory block manager 212 of FIG. 1.

Referring to FIG. 11, the memory block manager 212 may store a status information table. When memory blocks are managed as a super block, the status information table stored in the memory block manager 212 may be a super block status information table. The super block status information table may store status information of the super block.

An erase target super block may be a super block on which an erase operation is to be performed so as to secure a free block before data is programmed. The erase target super block may be a pre-program-target super block or a non-pre-program-target super block. In the pre-program-target super block its last page may be a programmed page, as determined by performing the read operation on the last page. In the non-pre-program-target super block its last page may be an erased page, as determined by performing the read operation on the last page.

The status information of the super block may be information representing whether or not a pre-program operation has been performed on the pre-program-target super block. Initial status information of the pre-program-target super block may be set to indicate that the pre-program operation has not yet been completed. Subsequently, when the pre-program operation on the pre-program-target super block is performed, status information of that super block may be updated to indicate that the pre-program operation has been completed.

In an embodiment, status information of the pre-program-target super block may have a value of 1 to indicate that the pre-program operation has been completed, and a value of 0 to indicate that the pre-program operation has not yet been completed. Of course, these values can be reversed, i.e., 0 to indicate pre-program operation completion and 1 to indicate that such operation has not yet been completed.

The super block status information table may store status information of pre-program-target super blocks among the zeroth to nth super blocks Super Block 0 to Super Block n described with reference to FIG. 9. In the illustrated embodiment, a value of 0 indicates that the pre-program operation has not been performed on the corresponding super block, and 1 indicates that the pre-program operation has been performed on the corresponding super block. Thus, as illustrated, a pre-program operation has not been performed on Super Block 0 and Super Block k, while such operation has been performed on Super Block 2.

Figure 12:
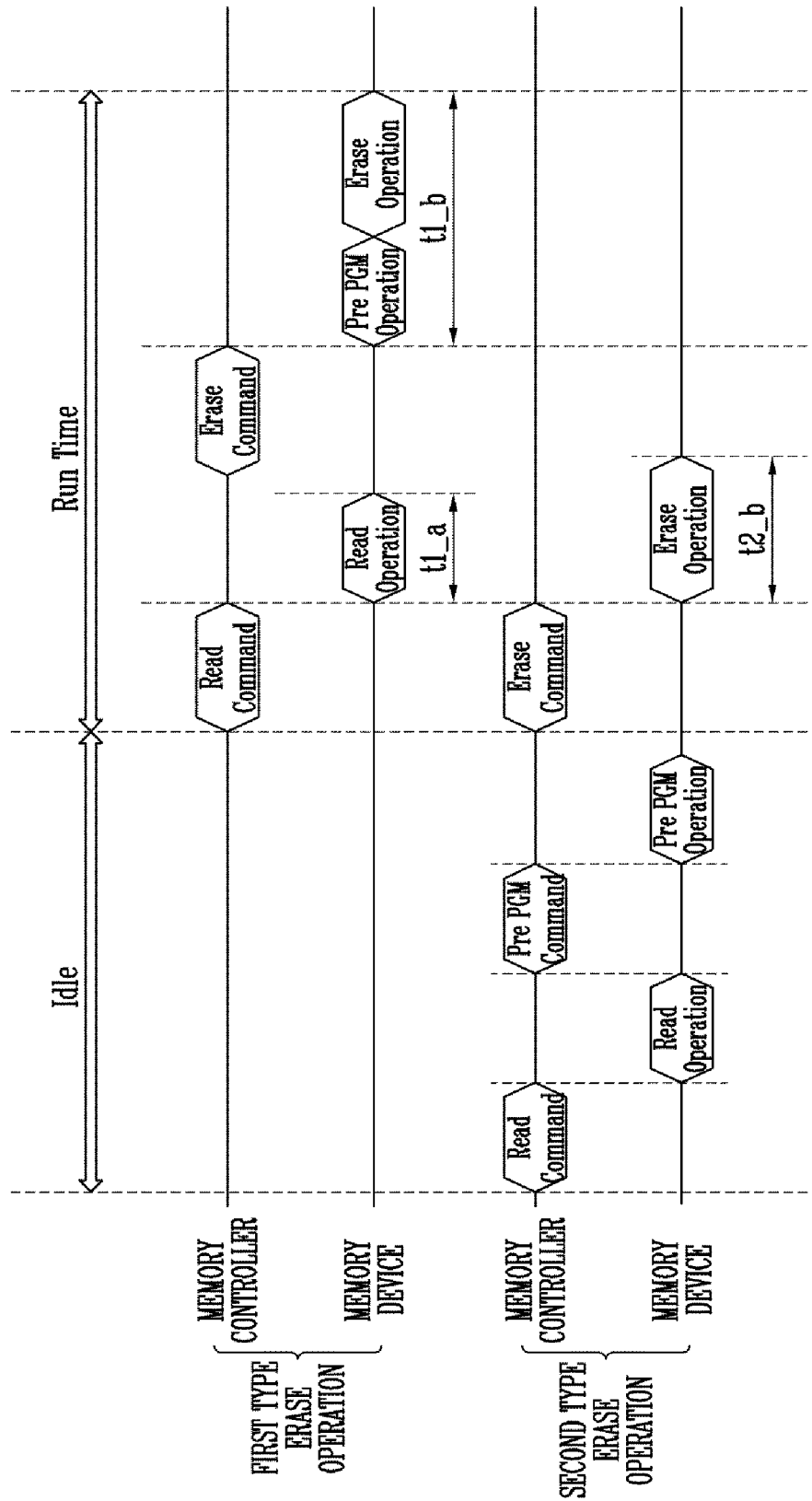
FIG. 12 is a diagram illustrating an erase operation in accordance with an embodiment of the present disclosure.

FIG. 12 is a diagram illustrating an erase operation in accordance with an embodiment of the present disclosure.

Referring to FIG. 12, each of a first type erase operation and a second type erase operation represents an erase operation performed before data is programmed in a memory block.

An erase target memory block may be a memory block on which an erase operation is to be performed so as to secure a free block before data is programmed. The erase target memory block may be a pre-program-target block or a non-pre-program-target block.

The pre-program-target block may be a memory block in which its last page is a programmed page, as determined by performing a read operation on the last page. The non-pre-program-target block may be a memory block in which its last page is an erase page, as determined by performing a read operation on the last page. A plurality of pages in a memory block may be sequentially programmed according to a predetermined sequence. The last page may be a page lastly programmed among the plurality of pages in the memory block.

In the first type erase operation, a read operation on a last page in the erase target memory block may be performed before the erase operation. When the last page is determined by the read operation to be a programmed page, a pre-program operation on the erase target memory block may be performed. When the last page is determined by the read operation to be an erased page, the pre-program operation on the erase target memory block may not be performed. Subsequently, an erase operation on the erase target memory block may be performed.

In the first type erase operation, the read operation, the pre-program operation, and the erase operation may be performed when the memory device is in a run time state. The memory device may perform the read operation in response to a read command provided by the memory controller. The memory device may perform the pre-program operation and the erase operation in response to an erase command provided by the memory controller.

As compared with the first type erase operation, in the second type erase operation the memory device starts performance of the read operation and the pre-program operation in an idle state, and performs only the erase operation in the run time state. Specifically, in order for the memory device to start the performance of the read operation and the pre-program operation in the idle state, the memory controller may provide the memory device with a read command and a pre-program command according to the result obtained by executing the read command. The read command may instruct the memory device to read a last page among a plurality of pages in the erase target memory block.

In the second type erase operation, when the last page is a programmed page, as determined by executing the read command, the memory controller may provide the pre-program command to the memory device. In an embodiment, when the memory device is performing another operation, the memory controller may not provide the pre-program command to the memory device even though the last page is determined to be a programmed page. In an embodiment, when the last page is an erase page, as determined by executing the read command, the memory controller may not provide the pre-program command to the memory device.

Although not illustrated, in the second type erase operation, in the case of a pre-program-uncompleted block on which the performance of the pre-program operation is not started when the pre-program-target block or the memory device is in the idle state, a pre-program operation may be performed when the memory device is in the run time state.

Specifically, when the memory device is in the run time state, the memory controller may read status information of the pre-program-target memory block. The status information may be information representing whether the pre-program operation has been performed on the pre-program-target memory block. When the status information represents a pre-program-uncompleted block, the memory controller may perform the pre-program operation and then perform the erase operation on the pre-program-target memory block.

In the first type erase operation, when the memory device is in the run time state, a total time required to erase the memory block may be a sum of a first read time $t1\_a$ and a first erase time $t1\_b$. In the second type erase operation, when the memory device is in the run time state, a total time required to erase the erase target memory block may be a second erase time $t2\_b$.

Thus, in the second type erase operation, when the memory device is in the run time state, the total time required to erase the memory block can be decreased by a value $(t1\_a+t1\_b)-(t2\_b)$ obtained by subtracting the second erase time from the sum of the first read time and the first erase time, as compared with the first type erase operation.

A read operation on a last page and a pre-program operation on a memory block may be performed in units of super blocks. Such a read operation on a super block may be on a page lastly programmed among a plurality of pages included in the super block. Such a pre-program operation on a super block may be performed in units of memory blocks on all memory blocks included in the super block.

Figure 13:
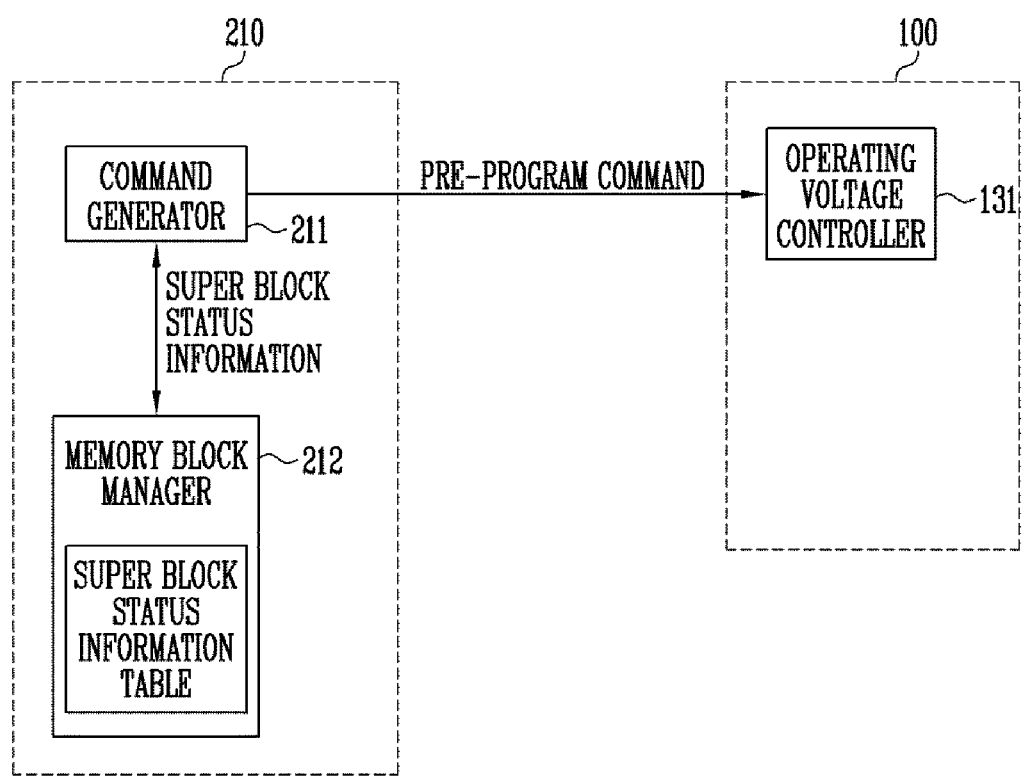
FIG. 13 is a diagram illustrating a process between a memory controller and the memory device in accordance with an embodiment of the present disclosure.

FIG. 13 is a diagram illustrating a process between the memory controller 200 and the memory device 100 in accordance with an embodiment of the present disclosure.

Referring to FIG. 13, the memory controller 200 described with reference to FIG. 1 may include the pre-program controller 210. The pre-program controller 210 may include the command generator 211 and the memory block manager 212.

When the memory device 100 in the idle state, the command generator 211 may generate a read command for an erase target super block, and provide the generated read command to the memory device 100. The read command may be for a last page among a plurality of pages included in the erase target super block.

The command generator 211 may generate a pre-program command according to a response from the memory device corresponding to the read command, and provide the generated pre-program command to the operating voltage controller 131.

In an embodiment, when the last page is a programmed page, as determined by executing the read command, the command generator 211 may provide the pre-program command to the operating voltage controller 131. In an embodiment, when the memory device 100 is performing another operation, the command generator 211 may not provide the pre-program command to the operating voltage controller 131 even though the last page is determined to be a programmed page. In an embodiment, when the last page is an erased page, as determined by executing the read command, the command generator 211 may not provide the pre-program command to the operating voltage controller 131.

Data of the programmed page may include at least one 0. Data of the erased page may all represent 1.

The memory block manager 212 may store the status information table as described with reference to FIG. 11. When memory blocks are managed as a super block, the status information table stored in the memory block manager 212 may be super block status information table. The super block status information table may store status information of the pre-program-target super block. The status information of the pre-program-target super block may be information representing to whether or not a pre-program operation has been performed on a pre-program-target super block among erase target super blocks.

The memory device 100 may include the operating voltage controller 131.

The operating voltage controller 131 may control voltages applied to the memory blocks included in the pre-program-target super block such that the pre-program operation is performed on the pre-program-target super block according to the received pre-program command. The pre-program command may be a command instructing the memory device 100 to perform the pre-program operation on the pre-program-target memory block before an erase operation is performed on that block. The pre-program operation may be performed in units of memory blocks. The pre-program operation may be an operation of moving a threshold voltage of all memory cells included in the memory block to a set threshold voltage distribution.

In an embodiment, when the memory device 100 is in the run time state, the memory controller 200 described with reference to FIG. 1 may read status information of the pre-program-target super block. When the read status information of the pre-program-target super block represents that a pre-program operation has been completed on the pre-program-target super block, the memory controller 200 may perform an erase operation on that super block. When the status information represents that a pre-program operation has not been completed on the pre-program-target super block, the memory controller 200 may perform the pre-program operation on that super block and then perform the erase operation.

Figure 14:
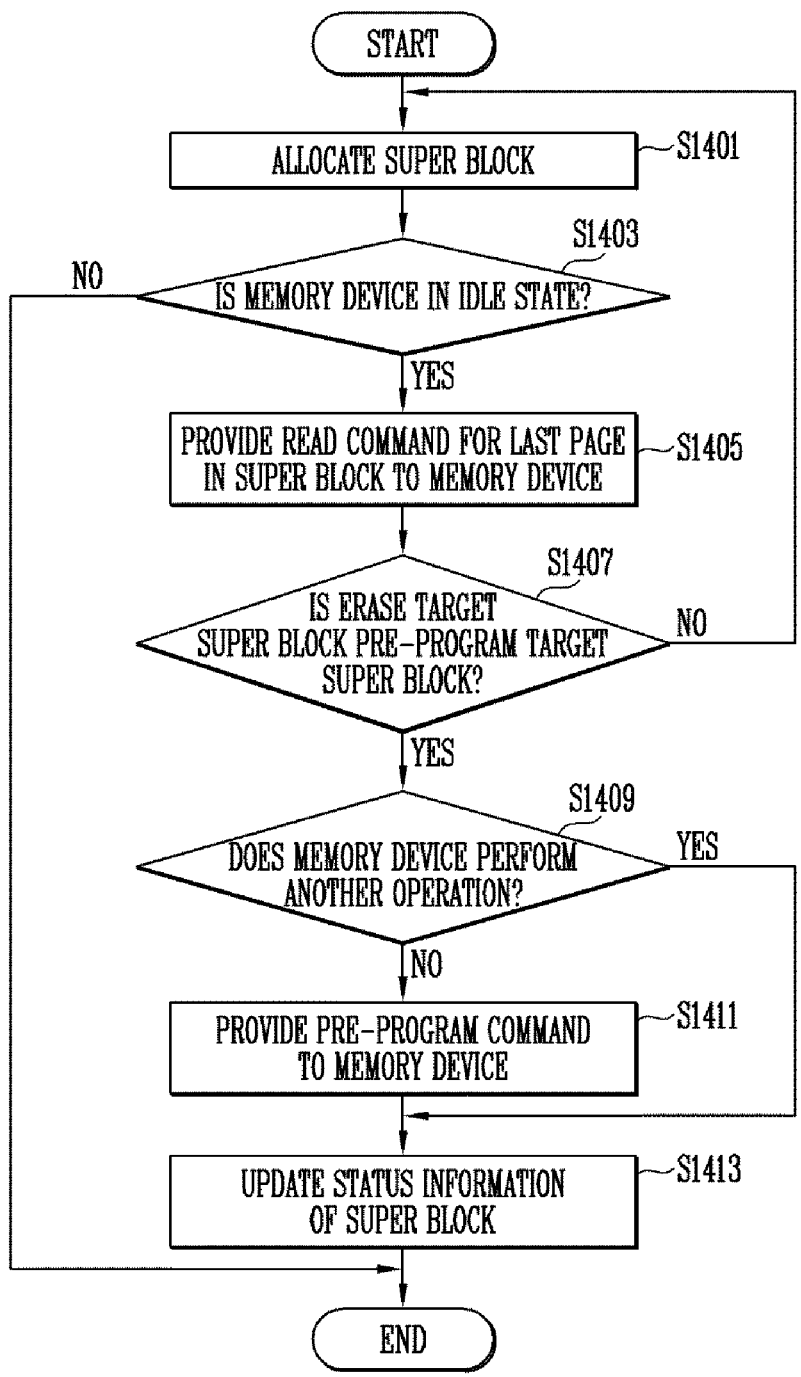
FIG. 14 is a flowchart illustrating an operation of the memory controller in accordance with an embodiment of the present disclosure.

FIG. 14 is a flowchart illustrating an operation of the memory controller in accordance with an embodiment of the present disclosure.

Referring to FIG. 14, in step S1401, the memory controller may allocate a super block. The super block may include at least two memory blocks in different planes among a plurality of memory blocks.

In step S1403, the memory controller may determine whether the memory device is in the idle state. When the memory device 100 is determined to be in the idle state, the memory controller proceeds to step S1405; otherwise, the operation is ended.

In the step S1405, the memory controller may provide the memory device with a read command for a last page among a plurality of pages included in an erase target super block.

The erase target super block may be a super block on which an erase operation is to be performed so as to secure a free block before data is programmed. The plurality of pages included in the super block may be sequentially programmed according to a predetermined sequence. The last page may be a page lastly programmed among the plurality of pages included in the super block.

In step S1407, the memory controller may determine whether the erase target super block is a pre-program-target super block, based on the result obtained by executing the read command. When the erase target super block is determined to be a pre-program-target super block, the memory controller proceeds to step S1409; otherwise, processing proceeds to the step S1401.

The pre-program-target super block may be a super block in which a last page among a plurality of pages included in the super block is programmed.

In the step S1409, the memory device may determine whether the memory device is performing another operation. When the memory device is determined to be performing another operation, the operation is ended; otherwise, the memory controller proceeds to step S1411.

In the step S1411, the memory controller may provide a pre-program command to the memory device for the pre-program-target super block.

In step S1413, the memory controller may update status information of a pre-program-target super block stored in the super block status information table. For example, the memory controller may update status information of the pre-program-target super block to indicate that the pre-program operation has been performed thereon.

Figure 15:
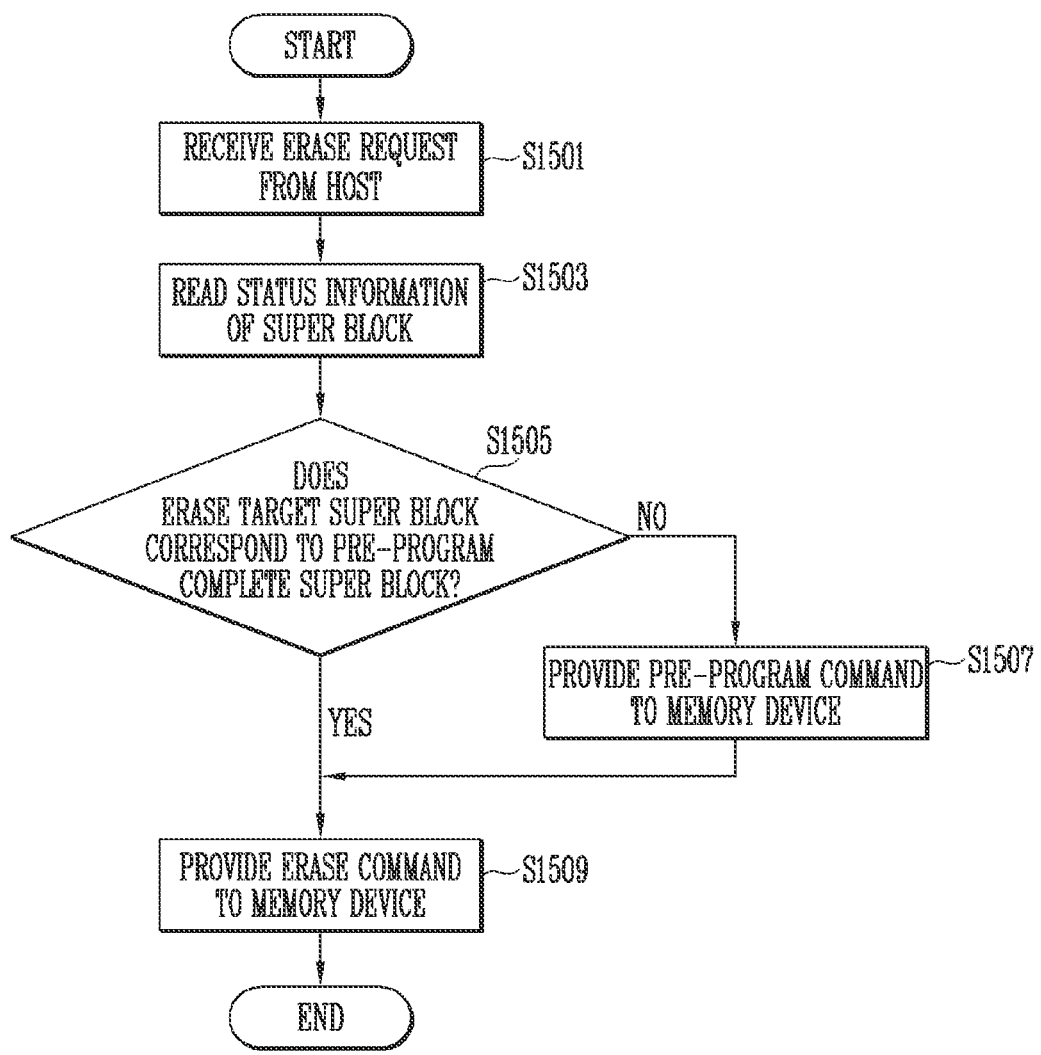
FIG. 15 is a flowchart illustrating an operation of the memory controller in accordance with an embodiment of the present disclosure.

FIG. 15 is a flowchart illustrating an operation of the memory controller in accordance with another embodiment of the present disclosure.

Referring to FIG. 15, in step S1501, the memory controller may receive an erase request for an erase target super block from the host.

In step S1503, the memory controller may read status information of the erase target super block.

In step S1505, the memory controller may determine whether the erase target super block corresponds to a pre-program-target super block on which a pre-program operation has been performed, based on the read status information of that super block. When the erase target super block is determined to be a pre-program-target super block on which a pre-program operation has been completed, the memory controller proceeds to step S1509. Otherwise, the memory controller proceeds to step S1507.

In the step S1507, the memory controller may provide to the memory device a pre-program command for the pre-program-target super block on which the pre-program operation has not been completed.

In the step S1509, the memory controller may provide to the memory device an erase command for the pre-program-target super block on which the pre-program operation has been completed.

Figure 16:
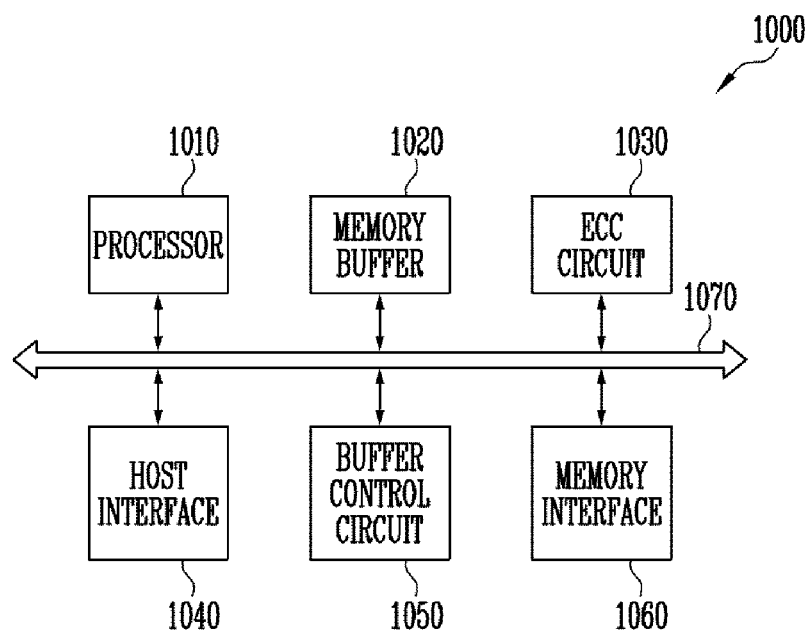
FIG. 16 is a diagram illustrating another embodiment of the memory controller of FIG. 1.

FIG. 16 is a diagram illustrating another embodiment of the memory controller of FIG. 1.

Referring to FIG. 16, a memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units, for example, a page mapping method, a block mapping method, and a hybrid mapping method. Any of these mapping methods may be used.

The processor 1010 is configured to randomize data received from the host. For example, the processor 1010 may randomize data received from the host, using a randomizing seed. The randomized data is to be provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050. One or both of the memory buffer 1020 and the buffer control circuit 1050 may be provided separately or its/their functions distributed within the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other so as not to interfere with, or influence, each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 17:
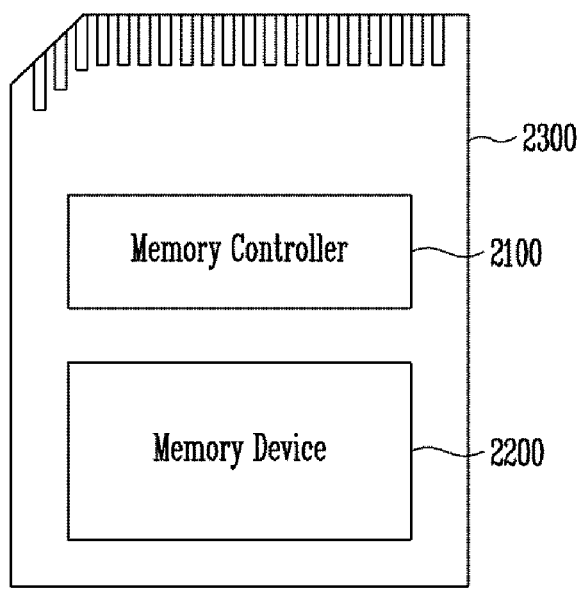
FIG. 17 is a block diagram illustrating a memory card system to which the storage device is applied in accordance with an embodiment of the present disclosure.

FIG. 17 is a block diagram illustrating a memory card system to which the storage device is applied in accordance with an embodiment of the present disclosure.

Referring to FIG. 17, the memory card system 2000 includes a memory controller 2100, a memory device 2200, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory controller 2100 may be implemented identically to the memory controller 200 described with reference to FIG. 1.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented by any of various nonvolatile memory devices such as an Electrically Erasable and Programmable ROM (EPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device to constitute a memory card such as a PC card (Personal Computer Memory Card International Association (PCM-CIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and/or a Universal Flash Storage (UFS).

Figure 18:
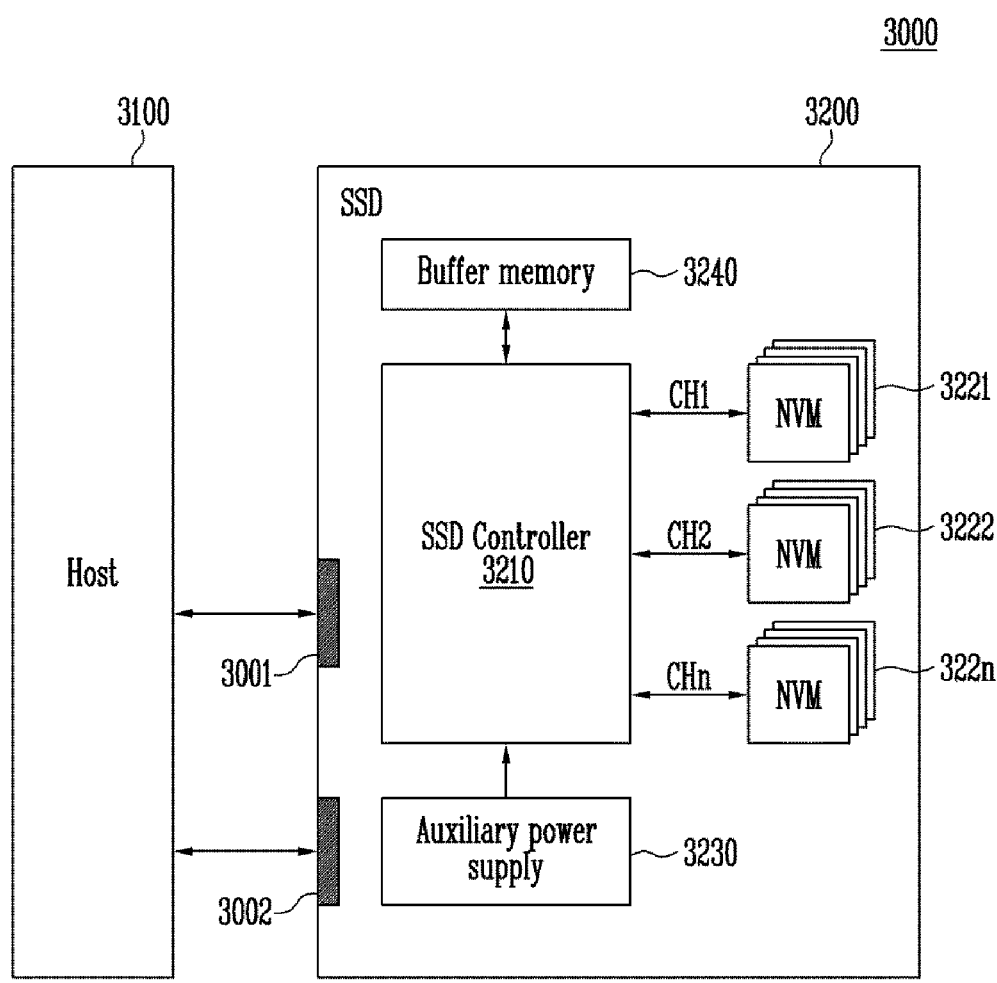
FIG. 18 is a block diagram illustrating a Solid State Drive (SSD) to which the storage device is applied in accordance with an embodiment of the present disclosure.

FIG. 18 is a block diagram illustrating a Solid State Drive (SSD) to which the storage device is applied in accordance with an embodiment of the present disclosure.

Referring to FIG. 18, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 2.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a Universal Serial Bus (USB), Multi-Media Card (MMC) an embedded MMC (eMMC), a Peripheral Component Interconnection (PCI), a PCI express (PCIe), an Advanced to Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 19:
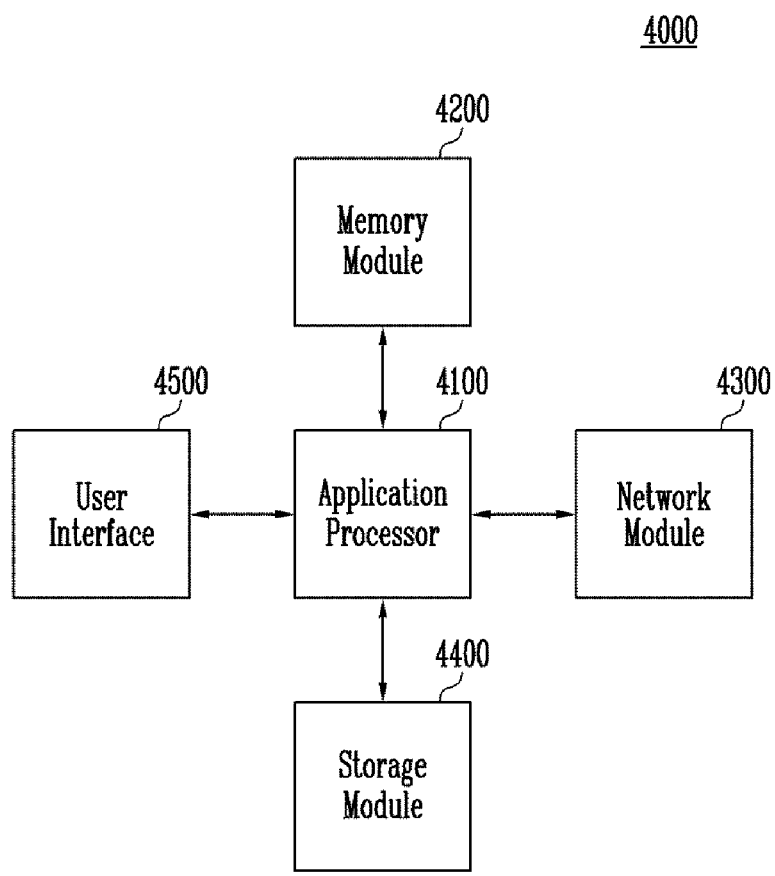
FIG. 19 is a block diagram illustrating a user system to which the storage device is applied in accordance with an embodiment of the present disclosure.

FIG. 19 is a block diagram illustrating a user system to which the storage device is applied in accordance with an embodiment of the present disclosure.

Referring to FIG. 19, the user system 4000 includes an application processor 4100, a memory module 4200, a network module 4300, a storage module 4400, and a user interface 4500.

The application processor 4100 may drive components included in the user system 4000, such as an operating system (OS), a user program, or the like. In an example, the application processor 4100 may include controllers for controlling components included in the user system 4000, e.g., interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package packaged based on a Package on Package (POP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIG. 2. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a motor.

In accordance with embodiments of the present disclosure, a memory controller having an improved erase operation speed and an operating method thereof are provided.

While the present disclosure has been illustrated and described with reference to embodiments thereof, it will be understood by those skilled in the art in light of the present disclosure that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The disclosed embodiments are only examples to facilitate an understanding of, but not limit, the present disclosure. That is, it should be apparent to those skilled in the art that various modifications can be made on the basis of the technological scope of the present disclosure.

Although specific terminologies are used here, they are used to explain, not limit, the embodiments of the present disclosure. Many variations and modifications are possible within the spirit and scope of the present disclosure, as those skilled in the art will recognize based on the technological scope of the present disclosure in addition to the embodiments disclosed herein.

What is claimed is:

1. A memory controller configured to control a memory device including a plurality of memory blocks, the memory controller comprising:
   a memory interface configured to exchange data with the memory device; and
   a pre-program controller configured to perform a read operation on a last page of a program sequence for a plurality of pages in an erase target memory block when the memory device is in an idle state, and perform a pre-program operation on the erase target memory block according to the result obtained by performing the read operation,
   wherein the erase target memory block is a memory block on which an erase operation is to be performed among the plurality of memory blocks, and
   wherein the erase operation on the erase target memory block is performed after the pre-program operation is performed.

2. The memory controller of claim 1, wherein the pre-program controller determines whether the erase target memory block has been pre-programmed according to the result obtained by performing the read operation.

3. The memory controller of claim 2, wherein, when data of the last page includes at least one 0 as the result obtained by performing the read operation, the pre-program controller sets the erase target memory block to be pre-programmed (pre-program target block).

4. The memory controller of claim 3, wherein the pre-program controller performs the pre-program operation on the target memory block, when the erase target memory block is set as the pre-program target block.

5. The memory controller of claim 3, wherein, when the memory device performs another operation, the pre-program controller does not perform the pre-program operation even though the erase target memory block is set as the pre-program target block.

6. The memory controller of claim 1, wherein, in the pre-program operation, a program pulse is applied to move a threshold voltage of memory cells included in the erase target memory block to a set threshold voltage distribution.

7. The memory controller of claim 6, wherein the set threshold voltage distribution corresponds to a highest program state.

8. The memory controller of claim 6, wherein the pre-program controller performs the pre-program operation without a program verify operation.

9. The memory controller of claim 1, wherein the pre-program controller includes a command generator configured to generate a read command for the last page and provide the generated read command to the memory device.

10. The memory controller of claim 9, wherein the command generator provides a pre-program command for the erase target memory block to the memory device according to a response to the read command.

11. The memory controller of claim 9, wherein the pre-program controller includes a memory block manager configured to store status information representing whether the pre-program operation on the erase target memory block has been performed.

12. The memory controller of claim 9, wherein the memory block manager updates the status information of the erase target memory block when the command generator provides the pre-program command for the erase target memory block to the memory device.

13. A memory controller configured to control a memory device including a plurality of memory blocks, the memory controller comprising:
   a memory interface configured to exchange data with the memory device; and
   a pre-program controller configured to read status information of an erase target memory block on which an erase operation is to be performed, among the plurality of memory blocks, and perform a pre-program operation on the erase target memory block according to the status information of the erase target memory block,
   wherein the erase operation on the erase target memory block is performed after the pre-program operation is performed, and
   wherein the status information represents whether the pre-program operation on the erase target memory block has been performed.

14. The memory controller of claim 13, wherein the pre-program controller performs the pre-program operation on the erase target memory block, when the status information of the erase target memory block represents that the pre-program operation has not been performed on the erase target memory block.

15. A method for operating a memory controller configured to control a memory device including a plurality of memory blocks, the method comprising:
    detecting the memory device is in an idle state;
    performing a read operation on a last page of a program sequence for a plurality of pages in an erase target memory block on which an erase operation is to be performed, among the plurality of memory blocks;
    performing a pre-program operation on the erase target memory block according to the result obtained by performing the read operation; and
    performing the erase operation on the erase target memory block after the performing of the pre-program operation.

16. The method of claim 15, wherein the pre-program operation is performed on the erase target memory block when data of the last page includes at least one 0 as the result obtained by performing the read operation.

17. The method of claim 15, further comprising storing status information representing whether the pre-program operation on the erase target memory block has been performed.

18. The method of claim 17, further comprising updating, when the pre-program operation on the erase target memory block is performed, the status information of the erase target memory block.

19. A memory controller configured to control a memory device including a plurality of planes each including a plurality of memory blocks, the memory controller comprising:
    a memory interface configured to exchange data with the memory device; and
    a pre-program controller configured to read a last page of a program sequence for a plurality of pages in an erase target super block, among super blocks, when the memory device is in an idle state, and perform a pre-program operation on the erase target super block according to the result obtained by reading the last page,
    wherein the super blocks each includes at least two memory blocks in different planes among the plurality of memory blocks,
    wherein an erase operation on the erase target super block is performed after the pre-program operation is performed, and
    wherein the erase target super block is a super block on which an erase operation is to be performed before data is programmed.

20. A memory controller configured to control a memory device including a plurality of planes each including a plurality of memory blocks, the memory controller comprising:
    a memory interface configured to exchange data with the memory device; and
    a pre-program controller configured to read status information of an erase target super block, and perform a pre-program operation on the erase target super block according to the status information,
    wherein the erase target super block is a super block on which an erase operation is to be performed before data is programmed, among super blocks, each including at least two memory blocks in different planes among the plurality of memory blocks, and
    wherein the status information represents whether the pre-program operation on the erase target super block has been performed.

* * * * *